April 16, 1968 R. V. KEYS 3,378,407

SOLAR CELL MODULE

Filed March 16, 1964

INVENTOR.
RICHARD V. KEYS

BY Lyon & Lyon

ATTORNEYS 3,378,407

SOLAR CELL MODULE

Richard V. Keys, Whittier, Calif., assignor, by mesne assignments, to Globe-Union Inc., Milwaukee, Wis., a corporation of Delaware Filed Mar. 16, 1964, Ser. No. 352,102
13 Claims. (Cl. 136—89)

ABSTRACT OF THE DISCLOSURE

A solar cell module having a metallic grid to which the bottom contacts of a plurality of solar cells are connected and a metallic bar connecting the contact strips of the cells, the grid having a tab that extends past the cells for connection to the bar of the next module.

This invention relates to photosensitive semiconductor devices, and more particularly relates to apparatus for mounting a plurality of solar cells.

Solar cells are semiconductor devices having a P–N junction lying immediately beneath the upper surface of a semiconductor wafer, a large area contact on the bottom surface of the wafer, and a thin contact strip formed on the upper surface of the wafer along one edge thereof. Such a device produces an electrical output in response to the impingement of radiation on its upper surface. In order to produce an electrical output sufficiently large enough to satisfy the requirements of most applications, it has been found necessary to mount large numbers of solar cells on a panel in selected electrical series and parallel relationships.

One common method of mounting these cells is to position their bottom contacts over corresponding contact areas of a printed circuit board and solder the contact areas together. A flexible metallic tab is positioned between the contact areas before soldering, and is of a length sufficient to extend outwardly beyond the end of the cell opposite to the end on which the contact strip is formed. A wire having a plurality of spaced, laterally displaced offset portions is then soldered to the aligned contact strips of all of the cells lying in a row. The tabs extending outwardly from the cell of the adjoining row are then wrapped around the offset portions, crimped and soldered.

Cell panels produced in this manner are subject to several factors which reduce their reliability. First, the laterally displaced offset portions of the wire extend above the level of the cells and thus is apt to be broken. Second, the solder sometimes runs down between the cells from a tab and wire connection and causes a short circuit between the cells. Third, this soldering step causes heat to be transmitted by the wire and the tab to the previously soldered joints, with the result that the solder at these joints softens or melts. While the solder will refreeze, the joint is often weakened or its electrical characteristics impaired. This problem is made even more serious by the fact that the cells are already mounted and thus these soldered joints cannot be inspected to detect any possible damage.

According to the present invention, mounting assembly apparatus is provided which eliminates these disadvantageous factors. A plurality of cells are first mounted in alignment on and soldered to a stamped out conductive grid and a bar of the same material from which the grid is made is soldered to the contact strips of the cell. Modules made in this manner are then mounted on a suitable base or board and are connected together by welding extensions of the grid of one group of cells to the bar of an adjacent group of cells. Since the welding heat is localized, no heat is transmitted to damage the soldered joints. The soldered joints therefore can be given a final inspection with the assurance that all joints will thereafter remain the same.

It is therefore an object of the present invention to provide an improved mounting assembly for photosensitive semiconductor devices.

It is also an object of the present invention to provide such an assembly in which a first group of semiconductor devices is electrically connected to a second group of semiconductor devices through welded joints.

It is another object of the present invention to provide a solar cell module for use in such an assembly.

These and other objects and advantages of the present invention will become more apparent upon reference to the accompanying description and drawings in which.

Figure 1:
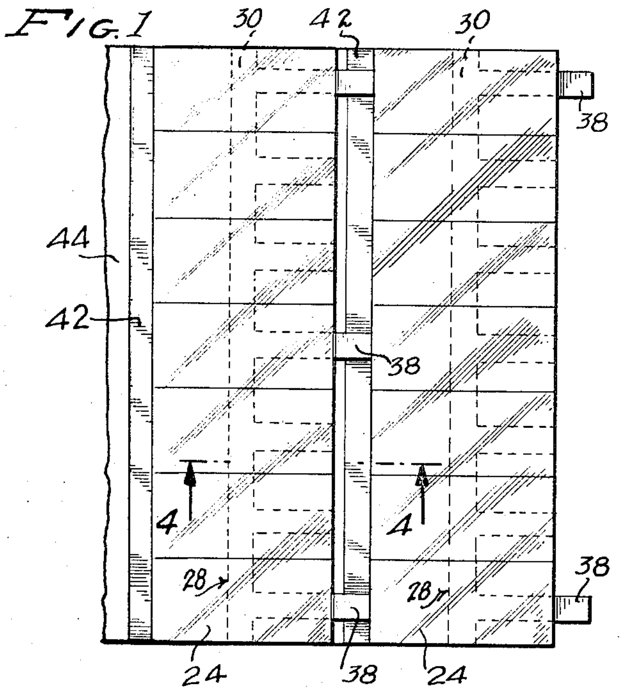
FIGURE 1 is a top plan view of a plurality of solar cells mounted in accordance with the present invention.
Figure 2:
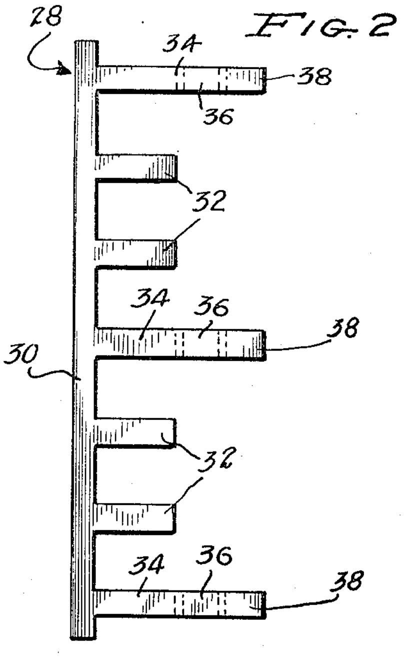
FIGURE 2 is a plan view of a grid for mounting a plurality of solar cells in accordance with the present invention.
Figures 3, 4:
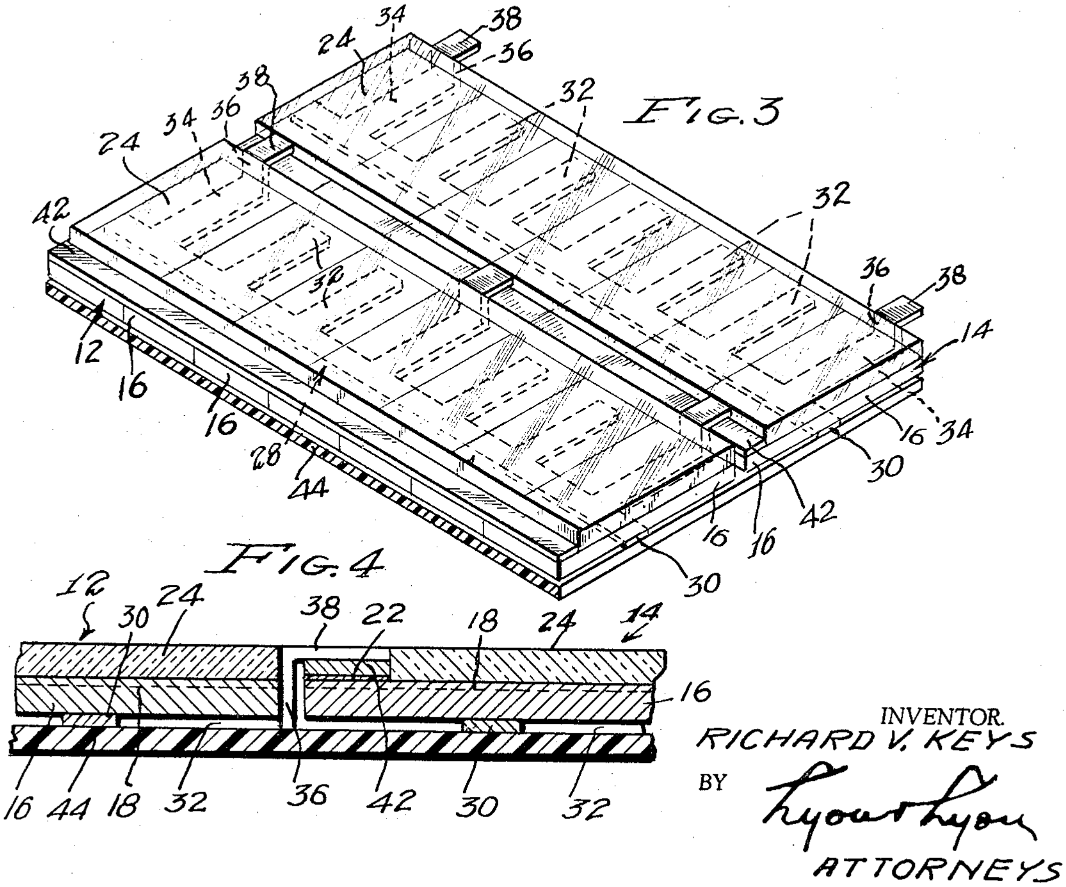
FIGURE 3 is a perspective view of the mounting assembly of the present invention.
FIGURE 4 is a cross-sectional view taken along lines 4—4 of FIGURE 1.

Referring now to the drawings, the assembly is shown to have first and second rows of solar cells, the cells in the first row being designated by the reference numeral 12 and the cells of the second row being designated by the reference numeral 14. It should be understood, of course, that any number of rows of cells can be used in accordance with the present invention. Each of the cells 12 and 14 comprises a wafer 16 of semiconductor material, preferably silicon, having a P-N junction 18 formed therein. The bottom surface of the wafer 16 is provided with a large contact area 20 while the upper surface has a contact strip 22 formed along one edge thereof. A cover 24 of any suitable glass is positioned over the upper surface of the wafer 16 with the exception of the area thereof on which the contact strip 22 is formed.

A stamped out grid 28 of a suitable metal has an elongated strip 30 from which extends a plurality of tabs 32, each tab corresponding to one of the solar cells and providing a larger area to which each cell can be soldered. Interspersed along the tabs 32 are tabs 34 which are of sufficient length to extend beyond the end of the cell to which they are soldered. Each of the tabs 34 has an extension including a vertical leg 36 and a horizontal leg 38. These legs are dimensioned so that the upper surface of the horizontal leg 38 will be flush with or below the upper surface of the glass cover 24, or the upper surface of the wafer if no cover is provided. The metal of which the grid 28 is formed should be chosen from those having a co-efficient of expansion which closely matches that of a semiconductor material used. In the case of silicon, titanium is suitable for this purpose.

After the cells have been soldered to the grid 28, a strip or bar 42 of the same metal as the grid 28 is laid along their aligned contact strips 22 and then soldered thereto. The module is now complete and ready to be mounted in concert with other similar modules.

As can be seen from the drawings, the module including the row of solar cells 12 is positioned adjacent the module containing the row of solar cells 14 so that the horizontal legs 38 of the extensions of the tabs 34 of the grid 20 associated with the cells 12 overlie the bar 42 associated with the cells 14. The modules are now bonded to the mounting base 44. The legs 38 are now welded to the strip 42 of the adjoining module to electrically connect the cells of the two modules. Since these two members are of the same material and are welded, the heat of welding is localized and does not in any way affect the previously soldered joints. Once these joints have been soldered and inspected they undergo no changes, and thus the reliability of the solar cell power is greatly increased.

The invention may be embodied in other specific forms not departing from the spirit or central characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. A solar cell module comprising: a plurality of semiconductor solar cells, each of said solar cells having a contact area on its bottom surface and a contact strip on its upper surface along one end thereof; a metallic grid; said solar cells being mounted on said grid with the contact strips thereof being aligned and with the bottom contact areas thereof being electrically and mechanically connected to said grid, said grid having a plurality of tabs constructed and arranged to provide support for each cell, at least one of said tabs extending beyond the ends of said solar cells opposite said one end thereof; and a bar of the same metal as said grid electrically and mechanically connected to the contact strip of each of said solar cells.

2. The module of claim 1 wherein said grid and said bar are of a metal having substantially the same thermal co-efficient of expansion as the semiconductor of said solar cells.

3. A solar cell module comprising: a plurality of semiconductor solar cells, each of said solar cells having a contact area on its bottom surface and a contact strip on its upper surface along one end thereof; a metallic grid, said grid including an elongated member and a plurality of integral tabs extending substantially normal to said member and constructed and arranged to provide individual support for each cell, at least one of said tabs having an extended portion at one end thereof; said solar cells being mounted on said grid with the contact strips thereof being aligned and with the bottom contact area of each of said cells being soldered to said elongated member and one of said tabs, said extended portion of said one tab extending beyond the ends of said solar cells opposite said one end thereof; and a bar of the same metal as said grid being soldered to the contact strip of each of said solar cells.

4. The module of claim 3 wherein said grid and said bar are of a metal having substantially the same thermal co-efficient of expansion as the semiconductor of said solar cells.

5. The module of claim 3 wherein said extended portion includes a vertical leg and a horizontal leg, said vertical leg extending upwardly from said tab, and said horizontal leg extending away from said solar cell.

6. The module of claim 5 wherein each of said solar cells is provided with a cover, the upper surface of said horizontal leg being flush with or below the upper surface of said covers.

7. A solar cell panel comprising: a non-conducting base; first and second solar cell modules fastened to said base, each of said modules including a plurality of semiconductor solar cells, each of said solar cells having a contact area on its bottom surface and a contact strip on its upper surface along one end thereof; a metallic grid; said solar cells being mounted on said grid with the contact strips thereof being aligned and with the bottom contact areas thereof being electrically and mechanically connected to said grid, said grid having a plurality of tabs constructed and arranged to provide support for each cell, at least one of said tabs extending beyond the ends of said solar cells opposite said one end thereof; and a bar of the same metal as said grid electrically and mechanically connected to the contact strip of each of said solar cells; said integral tab of said first module extending over and being welded to said bar of said second module.

8. The panel of claim 7 wherein said grids and said bars are of a metal having substantially the same thermal co-efficient of expansion as the semiconductor of said solar cells.

9. A solar cell panel comprising: a non-conducting base; a plurality of solar cell modules fastened to said base, each of said modules including a plurality of semiconductor solar cells, each of said solar cells having a contact area on its bottom surface and a contact strip on its upper surface along one end thereof; a metallic grid, said grid including an elongated member and a plurality of integral tabs extending substantially normal to said member and constructed and arranged to provide individual support for each cell, at least one of said tabs having an extending portion at one end thereof; said solar cells being mounted on said grid with the contact strips thereof being aligned and with the bottom contact area of each of said cells being soldered to said elongated member and one of said tabs, said extended portion of said one tab extending beyond the ends of said solar cells opposite said one end thereof; and a bar of the same metal as said grid being soldered to the contact strip of each of said solar cells; said extending portion of said one tab of each of said modules extending over and being welded to said bar of the next adjacent module.

10. The panel of claim 9 wherein said grids and said bars are of a metal having substantially the same thermal co-efficient of expansion as the semiconductor of said solar cells.

11. A solar cell panel comprising: a non-conducting base; a plurality of solar cell modules fastened to said base, each of said modules including a plurality of silicon solar cells, each of said solar cells having a contact area on its bottom surface and a contact strip on its upper surface along one end thereof; a metallic grid, said grid including an elongated member and a plurality of integral tabs extending substantially normal to said member and constructed and arranged to provide individual support for each cell, at least one of said tabs having an extended portion at one end thereof, said extended portion including a vertical leg extending upwardly from said tab and a horizontal leg extending outwardly therefrom; said solar cells being mounted on said grid with the contact strips thereof being aligned and with the bottom contact area of each of said cells being soldered to said elongated member and one of said tabs, and with the vertical leg of said extended portion of said one tab being positioned adjacent the ends of said solar cells opposite said one end thereof; and a bar of the same metal as said grid being soldered to the contact strip of each of said solar cells; said horizontal leg of the extending portion of said one tab of each of said modules extending over and being welded to said bar of the next adjacent module.

12. The panel of claim 11 wherein said grids and said bars are of a metal having substantially the same thermal co-efficient of expansion as silicon.

13. The panel of claim 11 wherein each of said solar cells is provided with a cover, the upper surface of each horizontal leg being flush with or below the upper surface of said covers.

References Cited

UNITED STATES PATENTS

| | | | |
|---|---|---|---|
| 3,009,006 | 11/1961 | Kostelec | 136—89 |
| 3,057,940 | 10/1962 | Fritts | 136—205 |
| 3,094,439 | 6/1963 | Mann et al | 136—89 |
| 3,111,352 | 11/1963 | Theodoseau | 136—89 X |
| 3,116,171 | 12/1963 | Nielsen et al. | 136—89 |
| 3,232,795 | 2/1966 | Gillette et al. | 136—89 |

ALLEN B. CURTIS, *Primary Examiner.*